United States Patent [19]

Dueber et al.

[11] Patent Number: 5,643,657
[45] Date of Patent: Jul. 1, 1997

[54] AQUEOUS PROCESSABLE, MULTILAYER, PHOTOIMAGEABLE PERMANENT COATINGS FOR PRINTED CIRCUITS

[75] Inventors: Thomas Eugene Dueber; Frank Leonard Schadt, III, both of Wilmington, Del.

[73] Assignee: E. I. du Pont de Nemours and Company, Wilmington, Del.

[21] Appl. No.: 431,376

[22] Filed: Apr. 28, 1995

[51] Int. Cl.$^6$ ............................................. B32B 9/00
[52] U.S. Cl. ............................. 428/209; 428/195; 428/483; 428/901; 430/262
[58] Field of Search ........................... 428/901, 195, 428/483, 269; 430/262

[56] References Cited

U.S. PATENT DOCUMENTS

| | | | |
|---|---|---|---|
| 3,469,982 | 9/1969 | Roland et al. | 96/35.1 |
| 3,547,730 | 12/1970 | Cohen et al. | 156/345 |
| 4,247,621 | 1/1981 | Sano et al. | 430/269 |
| 4,349,620 | 9/1982 | Cyr et al. | 430/259 |
| 4,352,870 | 10/1982 | Howard et al. | 430/271 |
| 4,438,189 | 3/1984 | Geissler et al. | 430/280 |
| 4,506,004 | 3/1985 | Sullivan | 430/312 |
| 4,621,043 | 11/1986 | Gervay | 430/281 |
| 4,937,172 | 6/1990 | Gervay | 430/280 |
| 4,987,054 | 1/1991 | Sondergeld et al. | 430/275 |
| 5,288,589 | 2/1994 | McKeever | 430/262 |

FOREIGN PATENT DOCUMENTS

| | | |
|---|---|---|
| 0115354 | 8/1984 | European Pat. Off. . |
| 0430175 | 6/1991 | European Pat. Off. . |
| 0 501 834 A1 | 9/1992 | European Pat. Off. . |
| 93/17368 | 9/1993 | WIPO . |

*Primary Examiner*—Patrick Ryan

[57] ABSTRACT

An aqueous processable, photoimageable element for use as a permanent coating for the protection of printed circuits composed of multiple layers of photoimageable compositions has sufficiently low tack to avoid premature adhesion to the printed circuit substrate but develops good adhesion to the circuit substrate upon application of heat and pressure during lamination.

39 Claims, No Drawings

AQUEOUS PROCESSABLE, MULTILAYER, PHOTOIMAGEABLE PERMANENT COATINGS FOR PRINTED CIRCUITS

BACKGROUND OF THE INVENTION

The present invention is directed to an aqueous processable, photoimageable element for use as a permanent coating for the protection of printed circuitry that is comprised of multiple layers of photoimageable compositions.

Photopolymerizable resist materials are known, for example, from U.S. Pat. Nos. 3,469,982 and 3,547,730, which describe a film resist with a sandwich structure in the form of a photopolymerizable layer between a cover sheet and a temporary support. This film resist can, for instance, be laminated on a copper base, exposed imagewise and developed with organic solvents or aqueous solutions, whereby a defined resist layer is formed. Typically the copper base for a printed circuit board is rigid, with limited flexibility of just a few degrees, such as the conventional copper-clad fiberglass epoxy laminates. More recently, printed circuits are being prepared on highly flexible film substrates to form electronic packages which may be folded and refolded one or more times to fit a specified configuration or a dynamic mechanical operation.

The defined resist layer thus produced can now be selectively etched, electroplated or treated with solder on the substrate. Particularly high demands are placed on photoresist films if they are used as permanent coatings that function as solder resists or masks. In this case, the developed, photopolymerized layer must withstand temperatures up to 300° C. without degradation, loss of adhesion or accumulation of residues contained in or on the molten solder. With the advanced technology of today's printed circuit boards, it is important to have the capability to photoimage a solder mask. According to the current state of the art, such solder masks can be made by spraying, coating or calendaring liquid compositions on a substrate or also by laminating a dry film on a substrate.

Due to the adverse environmental impact of solvents, aqueous developable photopolymer systems with fast development are now preferred. The use of photopolymer resists with acid functions, primarily carboxyl functions, is known to impart aqueous processability. However, these groups are disadvantageous in many subsequent steps or events. In the case of photoresists, delamination of the resist is observed in alkali etching or gold plating and, in the case of solder masks, inadequate environmental resistance can occur. Modification of the carboxyl groups with melamine formaldehyde compounds to overcome the named disadvantages is known (EP 01 15 354 and U.S. Pat. No. 4,247,621).

The utilization of polymers containing carboxylic acid groups that are subsequently converted to less reactive and less moisture sensitive species is also known. U.S. Pat. No. 4,987,054 discloses a photo-polymerizable formulation yielding improved properties containing an acid copolymeric binder wherein a copolymer structural unit is the half acid/amide of a dicarboxylic acid. The disclosed formulations are used with conventional rigid printed circuit boards, processed with wholly aqueous alkaline solutions and are storage stable. European Patent Application EP 430,175 discloses a photopolymeric system similar to U.S. Pat. No. 4,987,054.

International Patent Application WO 93/17368 discloses an aqueous processable, photoimageable, permanent coating for printed circuits comprising (a) a cobinder consisting of a low molecular weight amic acid copolymer and a high molecular weight carboxylic acid-containing copolymer, (b) an acrylated urethane monomer component, (c) a photoinitiator system, and (d) a thermal crosslinking agent. The coating compositions of the present invention, however, do not contain an amic acid copolymer binder component and have reduced tack when compared to the coatings disclosed in WO 93/17368.

Solvent developable multiple layer photoresist films for use in the etching of printed circuit detail are also known. For example, U.S. Pat. No. 4,349,620 discloses a multilayer photosensitive film for use in the protection of printed circuits wherein the photosensitive layers consist of a plurality of layers having different properties, i.e. greater adhesion to a copper surface provided by one layer and greater toughness and reduced adhesion to a temporary support provided by the other layer.

U.S. Pat. No. 4,352,870 discloses a two-layer photoresist film wherein improved photo resolution is obtained through the resist layer closer to the substrate having a greater photosensitivity.

U.S. Pat. No. 4,506,004 discloses an improved printed circuit board obtained by means of a two-layer composite coating. An inner adhesive photopolymer layer is applied to the PCB in the liquid state displacing air from the PCB surface. A dry film solder mask is then temporarily adhered to the underside of a screen printing frame and applied onto the liquid layer prior to processing of the photopolymer layer. The laminated dry film solder mask is exposed through a phototransparency to harden the light struck dry film solder mask and light struck inner layer photopolymer, thereby cojoining the dry film solder mask, inner layer and PCB surface. A solvent exposure step removes unexposed dry film solder mask and unexposed inner layer photopolymer.

As the electronic industry is driven towards faster, more reliable and compact devices, there is an increasing need in the printed circuit field for a more flexible, permanent coating that can withstand typical manufacturing process conditions, such as molten solder, and continuously varying environmental conditions while maintaining its integrity. The capability of such a coating to stand up to varied conditions and, in addition, be photoimageable and aqueous processable would constitute an advancement of the art. Current protective coatings for polyimide flexible circuitry require mechanical punching or drilling before lamination in an overall costly, low productivity process. Particularly preferred is a photoimageable, aqueous processable, permanent coating for use with flexible circuitry that can be made with conventional, lower cost photoforming manufacturing processes that have higher resolution capability, and wherein the flexible circuits can be subjected to flexural stress and yet maintain functionality.

SUMMARY OF THE INVENTION

The present invention relates to an aqueous processable, multilayer, photoimageable, permanent coating element, which comprises:

(a) a temporary support film;
(b) a first layer of a photoimageable permanent coating composition comprising:
  (i) an amphoteric binder;
  (ii) a carboxyl group containing copolymer binder of the formula

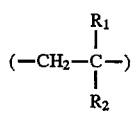

wherein R1 is H or alkyl; $R_2$ is phenyl or —$CO_2R_3$; and $R_3$ is H or alkyl which is unsubstituted or substituted with one or more hydroxy groups;
(iii) a monomer component containing at least two ethylenically unsaturated groups; and
(iv) a photoinitiator or photoinitiator system;
(c) a second layer of a photoimageable permanent coating composition comprising:
(i) a cobinder system comprising at least one low molecular weight copolymer binder component having a molecular weight of from 3,000 to 15,000 and containing from 2 to 50% by weight of at least one carboxylic acid containing structural unit and from 50 to 98% by weight of at least one structural unit of the formula

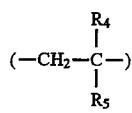

wherein $R_4$ is H, alkyl, phenyl or aryl; $R_5$ is H, $CH_3$, phenyl, aryl, —$COOR_6$, —$CONR_7R_8$ or —CN; and $R_6$, $R_7$ and $R_8$ independently are H, alkyl or aryl, which is unsubstituted or substituted with one or more hydroxy, ester, keto, ether or thioether groups; and at least one high molecular weight carboxylic acid containing copolymer binder component having a molecular weight of from 40,000 to 500,000 and containing structural units of the formula

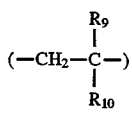

wherein $R_9$ is H, alkyl, —CN, phenyl, alkylphenyl or aryl; $R_{10}$ is phenyl, alkylphenyl, aryl, —$COOR_{11}$ or —$CONR_7R_8$; $R_{11}$ is H or alkyl; and wherein alkyl contains from 1 to 8 carbon atoms;
(ii) an acrylated urethane monomeric component;
(iii) a photoinitiator or a photoinitiator system; and
(iv) a blocked polyisocyanate crosslinking agent.

DETAILED DESCRIPTION OF THE INVENTION

The present invention relates to a photoimageable permanent coating composition that has sufficiently low tack to avoid premature adhesion when placed in contact with a printed circuit substrate, but yet develops good adhesion to the substrate upon application of heat and pressure during lamination. The coating composition effectively encapsulates raised relief structures without air entrapment and can be rapidly developed in aqueous 1% sodium or potassium carbonate in less than 5 minutes at 40° C. The coating composition also has acceptable end-use properties such as resistance to multiple 260° C. solder exposures for 2 to 6 seconds, resistance to gold plating baths and other permanent coating properties as described in the Institute for Printed Circuits (IPC) Solder Mask 840B Specification.

The present invention provides an overall balance of desirable properties by using at least two different layers of photoimageable permanent coatings. The layer of photoimageable coating in contact with the printed circuit substrate, or first layer, contains at least 5 parts by weight of an amphoteric binder which provides a layer having sufficiently low tack to avoid premature adhesion to the printed circuit substrate but develops good adhesion to the circuit substrate upon application of heat and pressure during lamination. The composition of the second and subsequent layers is formulated for obtaining the solder resistance and the end-use properties mentioned above. The combination of the first and second layers is more effective than a single layer of the same total thickness and the entire composition of these multiple layers.

The first layer of photoimageable permanent coating may be adjacent to a support film or a cover film. Preferably, the first layer is applied by conventional means to the temporary support film from a solution and then dried. The second layer of photoimageable permanent coating may be applied as a solution or a preformed layer to the exposed surface of the first layer by conventional means to obtain high adhesion between these two layers. In an alternative embodiment, the second layer also may be applied as a solution to the temporary support film, and then the first layer may be applied as a solution or a preformed layer to the exposed surface of the second layer by conventional means to obtain high adhesion between the two layers. In these two embodiments, a temporary support film is preferably laminated to the exposed surface of the second layer, or a cover film is laminated to the exposed surface of the first layer, respectively, so that the first and second photoimageable permanent coating layers are sandwiched between and protected by the support film and the cover film. For the two cases, the first layer should release from its protective cover layer before the second layer releases from its protective support layer. Upon removal of the cover film, the first layer can be applied to the printed circuitry while the second layer still remains protected. The first layer which is in contact with the circuit substrate, usually copper and dielectric, has low adhesion to the circuit substrate under ambient conditions, but develops high adhesion upon application of heat and pressure such as during vacuum or roll lamination processing. The first layer has high adhesion to the second layer, so that after lamination under heat and pressure, the remaining protective support film can be removed from the second layer without delamination between the two layers or between the first layer and the circuit substrate.

The first and second layers are developable with about the same concentration of aqueous alkaline solution, such as 1% sodium or potassium carbonate in less than 5 minutes at 40° C., so that the entire thickness of the first and second layers can be washed away in a single development step to leave a resist image of both layers on the substrate surface.

The combined thickness of the photoimageable layers depends on the relief pattern on the surface of the circuit substrate. Generally, the total thickness will be no greater than 125 microns (5 mils). When the permanent coating composition is used in vacuum or roll lamination, the total thickness will generally be no greater than 76 microns (3 mils). Normally, the first layer will comprise from 0.1 to 30%, preferably from 1 to 10%, of the combined layer thickness.

The first layer of photoimageable permanent coating, preferably, contains from 5 to 25 parts by weight of amphoteric binder, from 30 to 80 parts by weight of carboxyl containing copolymer binder, from 5 to 30 parts by weight of an ethylenically unsaturated monomer; and from 0.5 to 10 parts by weight of a photoinitiator or photoinitiator system.

The second layer of photoimageable permanent coating, preferably, contains from 20 to 80 parts by weight of a cobinder system comprising a low molecular weight copolymer component having carboxylic acid functionality and a high molecular weight carboxylic acid containing copolymer, from 10 to 40 parts by weight of an acrylated urethane monomer component; from 0.5 to 10 parts by weight of a photoinitiator or photoinitiator system; and from 5 to 25 parts by weight of a blocked polyisocyanate crosslinking agent.

Details of each of the components used in the multilayer, photoimageable permanent coating element of the present invention are described hereinbelow.

Temporary Support Film

Any of the support films generally known for use in photoresist films can be used in the present invention. The temporary support film, which preferably has a high degree of dimensional stability to temperature changes, may be selected from a wide variety of polyamides, polyolefins, polyesters, vinyl polymers and cellulose esters, and may have a thickness ranging from 6 to 200 microns. A particularly preferred support film is polyethylene terephthalate having a thickness of about 25 microns. The temporary support film can be surface treated to improve release properties with substances such as silicones. At least one surface of the support film may have a matte surface obtained by incorporation of filler particles in, or embossing the surface of, the temporary support film.

Cover Film

The photoimageable permanent coating layer may be protected by a removable cover film to prevent blocking when it is stored in roll form which is removed prior to lamination. The protective cover film may be selected from the same group of high polymer films described for the temporary support film, supra, and may have the same wide range of thicknesses. A cover film of 15–30 microns thick polyethylene or polypropylene, polyethylene terephthalate or silicone treated polyethylene terephthalate, are especially suitable. At least one surface of the cover film may have a matte surface obtained either by incorporation of filler particles in, or embossing the surface of, the cover film.

Amphoteric Binder

The first photoimageable permanent coating layer contains, as an essential component, from 5 to 25 parts of the layer composition of an amphoteric polymer binder.

The amphoteric polymers which are necessary components of the first layer of the photoimageable compositions of the invention are copolymers derived from the copolymerization of (1) at least one basic comonomer which is an acrylic or methacrylic acrylamide or methacrylamide, an aminoalkyl acrylate or methacrylate or mixture of any of these; (2) at least one acidic comonomer containing one or more carboxyl groups and (3) at least one further comonomer which is acrylic or methacrylic in character.

The applicable N-substituted acrylamides or methacrylamides are substituted with alkyl radicals containing from 1–12 carbon atoms. Among the applicable acrylamides and methacrylamides are included N-ethyl acrylamide, N-tertiary-butyl acrylamide, N-n-octyl acrylamide, N-tertiary-octyl acrylamide, N-decyl acrylamide, N-dodecyl acrylamide, as well as the corresponding methacrylamides. Suitable aminoalkyl compounds are the $(C_{1-4})$ alkyl $(C_{2-4})$ aminoalkyl acrylates and methacrylates.

Suitable acidic comonomers for the amphoteric polymers used in the invention are those having at least one available carboxylic acid group. These include acrylic acid, methacrylic acid, crotonic acid, itaconic acid, maleic acid, fumaric acid and the $C_1$–$C_4$ alkyl half esters of maleic and fumaric acids, such as methyl hydrogen maleate and butyl hydrogen fumarate as well as any other acidic monomers which are capable of being copolymerized with the particular copolymer system.

In order to modify or enhance certain properties of the amphoteric polymer, such as adhesion, compatibility, water solubility, hardness, flexibility, antistatic properties and the like, any of the following acrylic and methacrylic comonomers can be used: acrylic and methacrylic acid esters of aliphatic alcohols having from 1 to 12 carbon atoms such as methyl, ethyl, propyl, butyl, octyl and lauryl alcohols; hydroxyalkyl esters of acrylic and methacrylic acids such as hydroxypropyl acrylate and methacrylate, hydroxybutyl acrylate and methacrylate, hydroxystearyl acrylate and methacrylate, and hydroxyethyl acrylate and methacrylate; alkyl $(C_1$–$C_4)$ amino alkyl $(C_2$–$C_4)$ esters of acrylic and methacrylic acids such as N,N'-diethylaminoethyl acrylate, N-dimethylaminoethyl methacrylate, N-tertiary-butylaminoethyl methacrylate and the quaternization product of dimethylaminoethyl methacrylate and dimethyl sulfate, diethyl sulfate and the like; diacetone acrylamide; vinyl esters such as vinyl acetate and vinyl propionate; and styrene monomers such as styrene and alpha-methyl styrene.

Preferred amphoteric copolymers are those containing from about 30–60 parts by weight of the N-substituted acrylamide or methacrylamide, from 10–20 parts by weight of the acidic comonomer, and up to 55 parts by weight of at least one copolymerizable comonomer; these percentages being based on the total weight of the copolymer. The parts by weight given herein are to be taken so that the comonomers of the copolymer will total to 100 parts.

Particularly preferred because they combine the best physical properties for the invention are those copolymers containing from 35–45 parts by weight of N-tertiary-octyl acrylamide, from 12–18 parts by weight of acrylic or methacrylic acid, from 32–38 parts of methyl methacrylate, from 2–10 parts by weight of hydroxypropyl acrylate, and from 2–10 parts by weight of an alkyl $(C_1$–$C_4)$ amino alkyl $(C_2$–$C_4)$ acrylate or methacrylate.

Preparation of the above-described acrylic copolymers is described in U.S. Pat. No. 3,927,199 to Micchelli et al.

Carboxylic Copolymer Binder

The carboxyl containing copolymer binder used in the first layer of photoimageable permanent coating contains the structural unit of the formula

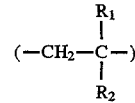

wherein $R_1$ is H or alkyl, $R_2$ is phenyl or —$CO_2R_3$; and $R_3$ is H or alkyl, which is unsubstituted or substituted with one or more hydroxy groups. Suitable comonomers which form the structural unit of the copolymer include styrene and unsaturated carboxylic acids and their derivatives, such as (meth) acrylic acid and (meth) acrylates. Methyl methacrylate, methyl acrylate, ethyl acrylate, butyl acrylate, ethyl methacrylate, butyl methacrylate, 2-hydroxyethyl acrylate and 2-hydroxyethyl methacrylate are particularly preferred.

The copolymer binder used in the first layer can be formed by direct copolymerization of one or more ethylenically unsaturated dicarboxylic acid anhydrides with one or more of the comonomers described above. Suitable ethylenically unsaturated dicarboxylic acid anhydrides are, for example, maleic anhydride, itaconic acid anhydride and citraconic acid anhydride. The copolymer binder containing acid anhydride functionality can be reacted with primary or secondary alcohols or amines.

When the permanent coating is photoprinted, development of the composition requires that the binder contains sufficient carboxylic acid groups to render the permanent coating processable in aqueous alkaline developer. The coating layer will be removed in portions which are not exposed to radiation but will be substantially unaffected in exposed portions during development by aqueous alkaline liquids, such as wholly aqueous solutions containing 1% sodium or potassium carbonate by weight for a time period of five minutes at a temperature of 40° C. The acid number of the copolymer binder used in the first photopolymerizable permanent coating layer should be 40 to 160, preferably 60 to 150, to also optimize adhesion to the printed circuit substrate.

In order to have sufficient conformability and resistance to drastic changes in environmental conditions, the permanent coating requires that the binder material have a glass transition temperature less than 100° C. The binder material for the first photopolymerizable permanent coating layer should have a glass transition temperature preferably from 30° C. to 100° C. If the Tg of the binder material is less than 30° C., adherence to the support film can be too high for desired release.

The proper molecular weight range is required for manufacturing purposes, such as solution viscosity and process latitude, as well as for a proper balance of permanent coating properties, such as toughness and solder resistance. A copolymer binder molecular weight range of from about 25,000 to 500,000 is suitable. The preferred range is from about 40,000 to 250,000.

The quantity of total copolymer binder present in the first photopolymerizable coating layer is generally 30 to 80 parts by weight relative to the total components of the permanent coating composition.

Monomer

The monomer used as a component of the first layer of photopolymerizable coating provides the capability of the permanent coating composition to photopolymerize and contributes to overall properties. In order to effectively do so, the monomer should contain at least two ethylenically unsaturated groups capable of undergoing polymerization on exposure to actinic radiation when incorporated in the permanent coating element. Excessive amounts of trifunctional acrylate monomers can result in reduction of required flexibility. For purposes of this invention, it is desirable to have a relatively lower level of monomer concentration in the first permanent coating layer in order to ensure that adhesion of the first layer to the support film is not excessive.

Suitable monomers which can be used as the sole monomer or in combination with others include acrylate and methacrylate derivatives of alcohols, isocyanates, esters, epoxides and the like. Examples are diethylene glycol diacrylate, trimethylolpropane triacrylate, pentaerythritol triacrylate, polyoxyethylated and polyoxypropylated trimethylolpropane triacrylate and trimethacrylate and similar compounds as disclosed in U.S. Pat. No. 3,380,831, di-(3-methacryloxy-2-hydroxypropyl) ether of tetrachlorobisphenol-A, di-(2-methacryloxyethyl) ether of tetrachlorobisphenol-A, di-(3-methacryloxy-2-hydroxypropyl) ether of tetrabromobisphenol-A, di-(2-methacryloxyethyl) ether of tetrabromo-bisphenol-A, triethylene glycol dimethacrylate, trimethylol propane triacrylate, polycaprolactone diacrylate, and aliphatic and aromatic urethane oligomeric di(meth) acrylates from Sartomer, West Chester, Pa. and Ebecryl® 6700 available from UCB Chemicals, Smyrna, Ga.

A particularly preferred class of comonomers is hexamethylene glycol diacrylate, triethylene glycol diacrylate, tripropylene glycol diacrylate, trimethylolpropane triacrylate, polyoxyethylated trimethylolpropane triacrylate, polyoxypropylated trimethylolpropane triacrylate, pentaerythritol tri- and tetraacrylate, bisphenol-A diacrylate, di-(3-acryloxy-2-hydroxypropyl) ether of bisphenol-A, di-(3-acryloxy-2-hydroxypropyl) ether of tetrabromobisphenol-A, or methacrylate analogues thereof as well as aliphatic urethane diacrylates CN 961 and CN 964, and aromatic urethane diacrylates CN 971 and CN 972 available from Sartomer, West Chester, Pa.

The quantity of total monomer is generally 5 to 30 parts by weight relative to the total components of the first photoimageable permanent coating layer.

Cobinder System

The cobinder system used in the second photoimageable coating layer comprises a low molecular weight copolymer binder component containing from 2 to 50% by weight of at least one carboxylic acid-containing structural unit, and from 50 to 98% by weight of at least one structural unit A of the formula:

wherein $R_4$ is H, alkyl, phenyl or aryl, preferably H or $CH_3$; $R_5$ is H, $CH_3$, phenyl, aryl, —$COOR_6$, —$CONR_7R_8$ or —CN, preferably phenyl, —$COOR_6$ or —$CONR_7R_8$; and $R_6$, $R_7$ and $R_8$ independently are H, alkyl or aryl, which is unsubstituted or substituted with one or more hydroxy, ester, keto, ether or thioether groups, preferably unsubstituted or hydroxy substituted alkyl or aryl groups.

The carboxylic acid-containing structural unit of the acid-containing low molecular weight copolymer binder component can be formed from any ethylenically unsaturated carboxylic acid, or carboxylic acid precursor comonomer that subsequently can be reacted to form the acid, and which will polymerize to form the desired low molecular weight copolymer. Examples of suitable ethylenically unsaturated carboxylic acid or carboxylic acid precursor comonomers include acrylic and methacrylic acids; maleic acid; maleic acid half ester or anhydride; itaconic acid; itaconic acid half ester or anhydride; citraconic acid; citraconic acid half ester or anhydride; and substituted analogues thereof.

Particularly preferred ethylenically unsaturated carboxylic acids are acrylic acid and methacrylic acid. The proportion of carboxylic acid-containing structural unit in the low molecular weight copolymer binder ranges from 2 to 50% by weight, and preferably from 5 to 25% by weight.

The molecular weight of the carboxylic acid-containing low molecular weight copolymer binder is in the range of 3,000 to 15,000, as measured by Gel Permeation Chromatography (GPC), preferably from 4,000 to 10,000.

Suitable comonomers, which form the structural unit A of the carboxylic acid containing low molecular weight copolymer binder include styrene, substituted styrenes, and unsaturated carboxylic acid derivatives, such as, for example, esters and amides of acrylic and methacrylic acids. Methyl methacrylate, ethyl methacrylate, butyl methacrylate, methacrylamide, methyl acrylate, ethyl acrylate, butyl acrylate, acrylamide, hydroxyethyl acrylate, hydroxyethyl methacrylate and styrene are preferred.

The cobinder system additionally contains at least one high molecular weight carboxylic acid-containing copolymer binder component to modify coated film integrity, adhesion, hardness, oxygen permeability, moisture sensitivity, and other mechanical or chemical properties required during its processing or end use. Suitable high molecular weight copolymer cobinders, which are used in combination with the low molecular weight carboxylic acid containing copolymer binder component, include monomers which form structural units B:

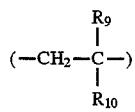

wherein $R_9$ is H, alkyl, —CN, phenyl, alkylphenyl or aryl; $R_{10}$ is phenyl, alkylphenyl, aryl, —COOR$_{11}$ or —CONR$_7$R$_8$; R$_{11}$ is H or alkyl; R$_7$ and R$_8$ independently are H, alkyl, or aryl which is unsubstituted or substituted with one or more hydroxy, ester, keto, ether, or thioether groups, preferably unsubstituted or hydroxy substituted alkyl or aryl groups.

The carboxylic acid-containing structural unit of the acid-containing high molecular weight copolymer binder component can be formed from any ethylenically unsaturated carboxylic acid, or carboxylic acid precursor comonomer that subsequently can be reacted to form the acid, and which will polymerize to form the desired high molecular weight copolymer. Examples of suitable ethylenically unsaturated carboxylic acid or carboxylic acid precursor comonomers include acrylic and methacrylic acids; maleic acid; maleic acid half ester or anhydride; itaconic acid; itaconic acid half ester or anhydride; citraconic acid; citraconic acid half ester or anhydride; and substituted analogues thereof.

Preferred comonomers for use in forming the high molecular weight copolymer binder component are styrene, methacrylic acid, methyl methacrylate, ethyl methacrylate, butyl methacrylate, acrylic acid, methyl acrylate, ethyl acrylate, hydroxypropyl methacrylate, hydroxyethyl acrylate, hydroxyethyl methacrylate and butyl acrylate. Methacrylic and acrylic acids are especially preferred comonomers in the cobinder for aqueous alkaline development. Other suitable high molecular weight carboxylic acid-containing copolymer binders are those comprising styrene and maleic anhydride/acid/half ester/ester, and substituted analogues thereof.

The proportion of the low molecular weight acid-containing copolymer binder component ranges from 2 to 50 weight %, and the proportion of the high molecular weight carboxylic acid copolymer binder component ranges from 50 to 98 weight %, based on the total weight of the cobinder system.

The cobinder system, comprising low and high molecular weight carboxylic acid-containing copolymer binder components, is critical for imparting desired properties to the second photoimageable coating layer. The low molecular weight carboxylic acid-containing binder component helps achieve end-use properties, such as encapsulation of circuit patterns without air entrapment, fast development in aqueous carbonate developer, flexibility, adhesion, resistance to environmental conditions, and resistance to alkali etching or plating solutions. The high molecular weight copolymer binder component is required for film integrity and flexibility of the cured film.

The cobinder system does not require the use of polymers containing carboxylic acid groups that are subsequently converted by reactions within the polymer to less reactive and less moisture sensitive species on curing, such as an amic acid copolymer binder containing the half acid/amide of a dicarboxylic acid. Moreover, the cobinder system does not require the use of such an amic acid polymer to obtain adequate adhesion to flexible circuitry, such as to copper, laminate adhesive or polyimide laminate materials. Furthermore, the cobinder system does not contain amic acid functionality and avoids a complicating side reaction with the blocked isocyanate used as crosslinking agent, and tends to produce less residue using aqueous developers. In addition, the low molecular weight copolymers, compared to low molecular weight amic acid polymers, reduce the amount of volatiles that are liberated at curing and soldering temperatures.

A preferred cobinder system comprises an admixture of from 2 to 50% by weight, most preferably from 4 to 45% by weight, of an acid-containing low molecular weight copolymer component having a molecular weight ranging from 3,000 to 15,000, most preferably from 4,000 to 10,000, an acid number of from 5 to 400, most preferably from 30 to 200 and a Tg of less than 50° and preferably less than 25° C., and from 50 to 98% by weight, preferably from 55 to 96% by weight of an acid-containing high molecular weight copolymer component having a molecular weight ranging from 40,000 to 500,000, most preferably from 100,000 to 250,000, an acid number of from 35 to 400, preferably from 50 to 200, and a Tg of 25° to 100° C., preferably from 30° to 55° C. The optimum ratio of low molecular weight copolymer to high molecular weight copolymer ranges from 0.05 to 0.55, preferably from 0.1 to 0.3.

A particularly preferred cobinder system comprises an admixture of 11.8% by weight of an acid-containing low molecular weight copolymer component having a monomer composition of 92/8 (by weight) ethyl acrylate/acrylic acid, a molecular weight of 7,000, an acid number of 63, and a Tg of −14° C., and 88.2% by weight of an acid-containing high molecular weight copolymer component having a monomer composition of 32/58/10 (by weight) methyl methacrylate/ethyl acrylate/acrylic acid, a molecular weight of 200,000, an acid number of 80, and a Tg of 37° C.

Acrylated Urethane Monomeric Component

An acrylated urethane is an essential component of the second photoimageable coating layer, since it imparts increased flexibility to the cured layer and reduces brittleness. Many factors influence the properties (e.g. glass transition temperature) and thus performance of urethane structures in a particular application. These factors include diisocyanate type, diol type (i.e. polyester, polyesteramide, polyether), diol molecular weight, codiols (i.e. short chain diols), ratio of diol to codiol, as well as the amount of branching and molecular weight of the resultant polyurethane. Properties after acrylation will vary correspondingly. It is important to choose the proper acrylated urethane and amount of such relative to the other essential ingredients in order to obtain a proper balance of flexibility, toughness and chemical resistance in the permanent coating. The acrylated urethane is present in an amount of from 5 to 30 parts by weight and contains at least one acrylate or methacrylate group.

Preferred types of acrylated urethanes have the general formula:

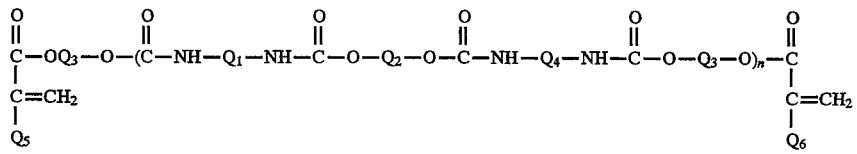

wherein $Q_1$ and $Q_4$ are aromatic groups which may be unsubstituted or substituted by lower alkyl groups and which can contain a lower alkylene group as a connecting member; $Q_2$ and $Q_3$ are independently polyoxyalkylene containing 1 to 10 carbon atoms; $Q_5$ and $Q_6$ are independently alkyl of 1 to 3 carbon atoms or H, and n is at least one.

Particularly preferred is a urethane diacrylate which is the reaction product of toluene diisocyanate with a polyol with the end isocyanate groups end-capped with hydroxyethyl acrylate.

The acrylated urethane may also include diacrylates and triacrylates which are carboxylated to provide acid numbers ranging from 1 to 50 or more and molecular weights ranging from 500 to 5000. Carboxylated urethane diacrylates and triacrylates are particularly advantageous since they provide cleaner development in aqueous basic developer. Suitable comonomers which can be used in combination with the acrylated urethane include the following: 1,5-pentanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylol-propane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl)ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-hydroxypropyl) ether of 1,4-butanediol, triethylene glycol dimethacrylate, trimethylol propane triacrylate, ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, 1,4-benzenediol dimethacrylate, and 1,3,5-triisopropenyl benzene and polycaprolactone diacrylate. Excessive amounts of trifunctional acrylate monomers can result in reduction of required flexibility.

A particularly preferred class of comonomers is hydroxy $C_1$-$C_{10}$-alkyl acrylate, hexamethylene glycol diacrylate, triethylene glycol diacrylate, tripropylene glycol diacrylate, pentaerythritol triacrylate, trimethylolpropane triacrylate, polyoxyethylated trimethylolpropane triacrylate, di-(3-acryloxy-2-hydroxypropyl) ether of bisphenol-A, di-(3-acryloxy-2-hydroxypropyl) ether of tetrabromo-bisphenol-A, or methacrylate analogues thereof.

Photoinitiator System

The photoinitiator system used in the first and second photoimageable coating layers contains one or more initiator compounds that directly furnish free-radicals when activated by actinic radiation. The system also may contain a sensitizer that is activated by the actinic radiation, causing the initiator compound to furnish the free-radicals. The sensitizer may extend spectral response into the near ultraviolet, visible, and near infrared spectral regions.

Numerous conventional photoinitiator systems are known to those skilled in the art and may be used herein provided they are compatible with the other ingredients of the coating composition. A large number of free-radical generating compounds, including redox systems such as Rose Bengal/2- dibutylaminothanol, may be selected to advantage. A useful discussion of dye sensitized photo-polymerization can be found in "Dye Sensitized Photo-polymerization" by D. F. Eaton in Adv. in Photochemistry, Vol. 13, D. H. Volman, G. S. Hammond, and K. Gollinick, eds., Wiley-Interscience, New York, 1986, pp. 427–487.

Sensitizers useful with photoinitiators include methylene blue and those disclosed in U.S. Pat. Nos. 3,554,753; 3,563,750; 3,563,751; 3,647,467; 3,652,275; 4,162,162; 4,268,667; 4,351,893; 4,454,218; 4,535,052; and 4,565,769. A preferred group of sensitizers include the bis(p-dialkylaminobenzylidene) ketones disclosed in Baum et al, U.S. Pat. No. 3,652,275, and the arylidene aryl ketones disclosed in Dueber, U.S. Pat. No. 4,162,162.

Preferred photoinitiator systems are 2,4,5-triphenylimidazolyl dimers in combination with chain transfer agents, or hydrogen donors, such as are disclosed in U.S. Pat. No. 3,479,185; 3,784,557; 4,311,783; and 4,622,286. Preferred hexaarylbiimidazoles (HABI) are 2-o-chlorosubstituted hexaphenyl-biimidazoles in which the other positions on the phenyl radicals are unsubstituted or substituted with chloro, methyl or methoxy. The most preferred initiator is o-Cl-HABI, i.e., 1,1'-biimidazole, 2,2'-bis(o-chlorophenyl)-4,4', 5,5'-tetraphenyl-imidazole dimer.

Hydrogen donor compounds that function as chain transfer agents in the photopolymer compositions include: 2-mercaptobenzoxazole, 2-mercaptobenzo-thiazole, 4-methyl-4H-1,2,4-triazole-3-thiol, etc.; as well as various types of compounds, e.g., (a) ethers, (b) esters, (c) alcohols, (d) compounds containing allylic or benzylic hydrogen, (e) acetals, (f) aldehydes, and (g) amides disclosed in column 12, lines 18 to 58 of MacLachlan U.S. Pat. No. 3,390,996. Suitable hydrogen donor compounds for use in systems containing both biimidazole type initiator and N-vinyl carbazole are 5-chloro-2-mercaptobenzo-thiazole; 2-mercaptobenzothiazole; 1H-1,2,4-triazole-3-thiol; 6-ethoxy-2-mercaptobenzo-thiazole; 4-methyl-4H-1,2,4-triazole-3-thiol; 1-dodecanethiol; and mixtures thereof.

A particularly preferred class of photoinitiators and photosensitizers are benzophenone, Michler's ketone, ethyl Michler's ketone, p-dialkylaminobenzaldehydes, p-dialkylaminobenzoate alkyl esters, polynuclear quinones, thioxanthones, hexaarylbiimidazoles, cyclohexadienones, benzoin, benzoin dialkyl ethers, or combinations thereof where alkyl contains 1 to 4 carbon atoms.

For purposes of this invention, it is preferred to utilize a photoinitiator system in the first photoimageable permanent coating layer that has an absorbence maximum at about the absorbence minimum for the second photoimageable layer. In this manner, sufficient incident exposure radiation will be able to pass through the second layer to expose the first layer in a similar time period as for the second layer.

Blocked Polyisocyanate Crosslinking Agent

A thermally activated crosslinking agent is used in the second photoimageable coating layer to improve mechanical or chemical properties of the coating. The crosslinking agent crosslinks with reactive functional groups, such as hydroxyl, carboxyl, amine and amide groups, which are present in the binders and other ingredients in the coating formulation. The presence of the proper crosslink imparts the capability to withstand molten solder temperatures and improves chemical resistance or other mechanical or chemical properties required in the end-use product.

The preferred crosslinking agent used herein is a blocked polyisocyanate which has a cleavage temperature of at least 100° C., or a mixture of polyisocyanates of this type. In the context of this description, this is to be understood as meaning a blocked polyisocyanate in which at least half of the blocked isocyanate groups are deblocked at a temperature of at least 100° C. and are thereby available for reaction with the isocyanate-reactive functional groups of the other components of the photoimageable coating.

The polyisocyanate on which the blocked component is based may be any aliphatic, cycloaliphatic, aromatic or arylaliphatic compounds having at least two, preferably two to four, isocyanate groups and which may have further substituents which are inert to isocyanate groups, such as alkyl or alkoxy groups.

These include, for example, the following compounds: 2,4-diisocyanatotoluene, and technical grade mixtures thereof with 2,6-diisocyanatotoluene, 1,5-diisocyanatonaphthalene, 1,4-diisocyanatonaphthalene, 4,4'-diisocyanatodiphenylmethane and technical grade mixtures of various diisocyanatodiphenylmethanes (for example the 4,4'- and 2,4'-isomers), diisocyanato-m-xylylene, N,N'-di(4-methyl-3-isocyanatophenyl)urea, 1,6-diisocyanatohexane, 1,12-diisocyanatododecane, 3,3,5-trimethyl-1-isocyanatomethylcyclohexane(isophorone diisocyanate), trimethyl-1,6-diisocyanatohexane, 1-methyl-2,4-diisocyanatocyclohexane, trisisocyanato-triphenylmethane and 4,4'-diisocyanatodicyclo-hexylmethane.

The polyisocyanates may be blocked by various radicals. Examples of suitable blocking components are beta-dicarbonyl compounds, such as malonates, acetoacetates or 2,4-pentanedione, or hydroxamates, triazoles, imidazoles, tetrahydropyrimidines, lactams, oximes, ketoximes, low molecular weight alcohols, or phenols or thiophenols.

The blocked polyisocyanate may also be a urethanized, carbodiimidated, biuretized, or dimerized or trimerized polyisocyanate, a trimer containing an isocyanurate ring, a biscyclic urea compound, a polymeric isocyanate, a copolymer of two or more diisocyanates, or other forms of polyisocyanates which are inactive below 100° C., so long as their cleavage temperature is at least 100° C. Examples of these are urethanized 4,4'-diisocyanato-diphenylmethane, carbodiimidated 4,4'-diisocyanatodiphenylmethane, uretdione of 2,4-diisocyanatotoluene, the trimer of diisocyanatotoluene, N,N',N''-tri(6-isocyanatohexyl)-biuret, isophorone diisocyanate, trimeric hexane diisocyanates, trimeric dodecane diisocyanates, adipoyl bis(propylene urea), and azelaoyl bis(propylene urea).

Preferred blocked polyisocyanates have a cleavage temperature between 100° C. to 200° C. Particularly preferred herein are methylethyl ketoxime blocked 1,6-diisocyanatohexane trimers and methylethyl ketoxime blocked isophorone diisocyanate.

The amount of blocked polyisocyanate crosslinking agent used in the second photoimageable layer ranges from 5 to 25 parts by weight relative to the total amount of components in the second coating layer.

Compared with photoimageable coating compositions containing conventional melamine-formaldehyde crosslinking agents, the photoimageable coating compositions of the present invention are distinguished, surprisingly, by higher elongation and better chemical resistance at lower cure temperature. In addition, the cured coatings maintain their flexibility after cure, whereas coatings using melamine-formaldehyde crosslinking agents require a 20° C. higher cure temperature to obtain the same flex stability after cure, and sometimes lose some of this flexibility while aging under cool and/or dry conditions. To maintain stability of the laminate material, the cure temperature should be as low as possible above 100° C., since flexible circuits undergo more distortion at higher cure temperatures.

Fillers

The aqueous processable, photoimageable permanent coating compositions may contain a preformed macromolecular elastomeric component as an organic filler. This elastomeric component typically is present as a separate micro-phase in the aqueous processable permanent coating composition, and as such is believed to be functioning as an elastomeric filler for the composition. Typically, such organic components contain substantially no acidic groups and consequently are insoluble in aqueous, alkaline developer solutions. However, dispersibility in the permanent coating composition and aqueous, alkaline developer solutions may be improved by incorporating sufficient carboxylic acid groups into the organic filler component if improvement in such development is required.

Although many elastomers may be used in the permanent coating composition, poly(methyl methacrylate-co-butadiene-co-styrene) is preferred. Other organic fillers which may be used include synthetic flexible polymers and rubbers, e.g., butadiene-co-acrylonitrile, acrylonitrile-co-butadiene-co-styrene, methacrylate-co-acrylonitrile-co-butadiene-co-styrene copolymers, and styrene-co-butadiene-co-styrene, styrene-co-isoprene-co-styrene block copolymers; saturated polyurethanes; poly(methyl-methacrylate-co-butylacrylate); and the like. Further examples of organic filler components include conventional elastomers as defined on page 232 of "Hackh's Chemical Dictionary" Fourth Edition, Edited by J. Grant, McGraw-Hill Book Company, 1972.

The permanent coating compositions may also contain other organic fillers or inorganic particulates to modify the mechanical or chemical properties required during processing or end use. Suitable fillers include organic or inorganic reinforcing agents which are essentially transparent as disclosed in U.S. Pat. No. 2,760,863, e.g., organophilic silica bentonite, silica, and powdered glass having a particle size less than 0.4 micrometer; inorganic thixotropic materials as disclosed in U.S. Pat. No. 3,525,615 such as boehmite alumina, clay mixtures of highly thixotropic silicate oxide such as bentonite and finely divided thixotropic gel containing 99.5% silica with 0.5% mixed metallic oxide; microcrystalline thickeners as disclosed in U.S. Pat. No. 3,754,920 such as microcrystalline cellulose and microcrystalline silicas, clays, alumina, bentonite, kalonites, attapultites, and montmorillonites; finely divided powders having a particle size of 0.5 to 10 micrometers as disclosed in U.S. Pat. No.

3,891,441 such as silicon oxide, zinc oxide, and other commercially available pigments; and the binder-associated, transparent, inorganic particles as disclosed in European Patent Application 87113013.4 such as magnesium silicate (talc), aluminum silicate (clay), calcium carbonate and alumina. Typically, the filler is transparent to actinic radiation to preclude adverse effects during imaging exposure. Depending on its function in the photopolymerizable composition, the filler may be colloidal or have an average particle size of 0.5 micrometers or more in diameter.

The filler may be present in the first, second or both photoimageable permanent coating layers at 0 to 30 parts by weight of the permanent coating layer composition.

Adhesion Promotor

The permanent coating compositions may also contain a heterocyclic or mercaptan compound to improve adhesion of the coatings to the metal circuit pattern during processing or in the end-use product. Suitable adhesion promotors include heterocyclics such as those disclosed in Hurley et al, U.S. Pat. No. 3,622,334, Jones, U.S. Pat. No. 3,645,772, and Weed, U.S. Pat. No. 4,710,262. Preferred adhesion promoters include benzotriazole, 5-chloro-benzotriazole, 1-chloro-benzotriazole, 1-carboxy-benzotriazole, 1-hydroxy-benzotriazole, 2-mercapto benzoxazole, 1H-1,2,4-triazole-3-thiol, 5-amino-1,3,4-thiadiazole-2-thiol, and mercapto-benzimidazole.

Other Components

Other compounds conventionally added to photopolymer compositions may also be present in the permanent coating to modify the physical properties of the film. Such components include: thermal stabilizers, colorants such as dyes and pigments, coating aids, wetting agents, release agents, and the like.

Thermal polymerization inhibitors that can be used in the permanent coating compositions are: Irganox® 1010, p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, p-toluquinone and chloranil. Also useful as thermal polymerization inhibitors are the nitroso compounds disclosed in U.S. Pat. No. 4,168,982.

Various dyes and pigments may be added to increase the visibility of the resist image. Any colorant used, however, should preferably be transparent to the actinic. radiation used.

Permanent Coating Process

The multilayer permanent coating of the invention can be used as a solder mask to protect printed circuits during subsequent processing, primarily solder operations, and/or from environmental effects during use. Permanent coatings also are used as intermediate insulative layers, with or without development, in the manufacture of multilayer printed circuits.

In practice, a multilayer, permanent coating element of this invention, with the photoimageable layers typically between 10 and 125 micrometers (0.4 and 5 mils) thick, is applied to a printed circuit substrate which typically is a printed circuit relief pattern on a substrate that is semi-rigid, such as fiberglass reinforced epoxy, or on a flexible film substrate based on polyimide or polyester film. The applied multilayer, photopolymerizable, permanent coating element is then imagewise exposed to actinic radiation to harden or insolubilize exposed areas. Any unexposed areas are then completely removed typically with an alkaline, aqueous sodium or potassium carbonate developer solution which selectively dissolves, strips or otherwise disperses the unexposed areas without adversely affecting the integrity or adhesion of the exposed areas. The developed permanent resist image is first treated to further cure or harden it by baking at elevated temperatures, such as one hour at 150° C., by additional uniform exposure to actinic radiation or a combination thereof to produce a circuit board having a cured permanent resist layer covering all areas except unexposed areas that have been removed by development. Electrical components are then inserted into the through-holes or positioned on surface mount areas and soldered in place to form the packaged electrical component.

Dry Film Lamination

A pre-formed, dry-film, photoimageable permanent coating layer is applied from a multi-ply, transfer, coverlay element using the lamination process as described in Celeste, U.S. Pat. No. 3,469,982. The multilayer, permanent coating element comprises a temporary support film, a first layer of a photoimageable permanent coating composition of the invention and a second layer of a photoimageable permanent coating composition of the combined invention with the photoimageable layers typically between 10 to 125 micrometers (0.4 to 5 mils) thick when used over printed circuit substrates. As described in Celeste supra, the cover film, if present, is first removed and the uncovered permanent coating surface of the first photoimageable layer is laminated to the pre-cleaned copper printed circuit surface of the substrate using heat and/or pressure, e.g., with a conventional hot-roll laminator. Although the laminate is typically imagewise exposed to actinic radiation through the temporary support film, in some instances, the temporary support may be removed before imaging to improve resolution and other such properties. Typically, when a dry film is laminated to a printed circuit substrate having a low circuit relief, measures must be taken to eliminate entrapped air, e.g., from around circuit lines. Entrapped air is eliminated by the vacuum lamination process of Friel U.S. Pat. No. 4,127,436, or by the grooved roll lamination process of Collier et al., U.S. Pat. No. 4,071,367.

Permanent Coating Evaluation

Printed circuits must withstand a variety of tests that are dependent on the application of the circuits, which in turn governs the type of material used as the circuit substrate. A stringent application is for flexible printed circuits which require a fold or bend for a particular space requirement, such as a camera or video cassette recorder (VCR), and may require the capability of surviving multiple bends, such as in a computer disc drive. In some applications a flexible circuit is combined with a rigid circuit to form a flex-rigid multilayer printed circuit. The end use tests for flexible circuits focus on adhesion and the capability to withstand single or multiple bends. In addition, accelerated aging is a useful test to simulate the practical concern of film aging on standing at ambient conditions for an extended period of time. The accelerated aging by exposure of the film to heat and humidity is effective for identifying film components that may oxidize or otherwise degrade more quickly than others. The tests that are used to support the Examples in this application are described herein.

Time To Clear

This test evaluates the retention time for adequately developing coverlay. Coverlay is laminated onto a rigid substrate, then timed when placed through a 1% sodium carbonate or potassium carbonate developer solution (which should be at the same temperature as that used in actual processing, typically 40° C.). The total "time to clear" is reported in seconds, beginning from the time the sample enters the developer and ending at the time at which all of the unexposed coverlay is washed off of the substrate.

Photo Speed

This test evaluates the processability of coverlay. Green coverlay is laminated onto a substrate, then is exposed to 500 mj/cm$^2$ UV through a 21-step Stouffer sensitivity photopattern. After the sample is developed, the resulting step-wedge pattern is analyzed. Values are reported in a X–Y range, in which the X value is the last step in which no developer attack is noted and Y is the last step containing coverlay. The optimum exposure level is obtained at a y value of 10 to 12. High x values indicate low attack of the photopolymer by the developer.

Encapsulation

This test evaluates the capability of coverlay to adequately protect the substrate. The substrate and coverlay chosen for this test should represent those in end-use applications. The substrate is typically a circuit pattern and is processed with the coverlay exactly as is done in actual manufacturing. After processing, the sample is evaluated using 10× magnification for any haloing and/or delaminations, which constitute a failure. In addition, the sample is cross-sectioned along the edge of a circuit line and evaluated using magnification to ensure that coverlay adequately covers the area with no "soda-strawing" defects. Before samples are processed further they should pass this encapsulation test. All of the examples of the invention passed the encapsulation test.

Cross-Hatch Adhesion

This test is performed according to ASTM D-3359-79, Method B. Test substrates are selected to duplicate the material typically used for end-use, and are processed to mirror actual processing.

Test substrates are either chemically cleaned substrates or substrates used without any pre-cleaning or etching of the copper surface. The samples that are chemically cleaned are cleaned in a series of steps with immersion first in Versa Clean® 415 for 2 minutes at 45° to 50° C. followed by immersion for 30 seconds in a deionized water bath. The samples are then immersed in Sure Etch® 550 micro etching solution for one minute at 35° C., followed by a deionized water rinse for 30 seconds. The samples are finally immersed in 10% sulfuric acid solution at room temperature for 30 seconds and given a final deionized water rinse. Samples are dried and placed immediately in a nitrogen atmosphere until used.

The test areas are a blank copper area and a blank adhesive area. Specimens are tested "after cure" as well as "after solder" exposure, which simulates solder exposure during PCB fabrication. Typical "after solder" specimens are floated in 288° C. 60/40 tin/lead solder for 30 seconds. Residual solder is then removed before evaluation. All specimens are scored with a 10 blade Gardco blade, then the sample is rotated 90° and rescored so that a cross-hatch pattern comprised of 100 squares is cut into the coverlay surface. Adhesive tape is applied and rubbed to ensure good contact, then pulled away at a 90° angle in a smooth fluid motion. The sample is examined using 10× magnification for defects, typically delamination or microcracks. Pick off from the cutting blade of 1–2% is not considered a failure but >2% pickoff is a failed sample.

Bend & Crease

The substrate to be used for this test is typically a MIT flexural endurance pattern. The MIT pattern is a meander pattern that has alternating one mm lines and spaces in the region of the testing. The sample is creased perpendicular to the direction of the lines and spaces. The substrate is typically the same type as that used in the actual product application. The thickness and type of substrate (copper, adhesive) and the processing steps (pre-clean, lamination, cure, solder exposure) are duplicated so that the evaluation reflects a true simulation. Typically a TecLam_LF9110 substrate is used with copper etched off of one side. A Riston® photoresist is applied to one side of the double side clad and the copper is etched off of the other side using ammoniacal cuprous chloride solution at 58° C. The Riston® film is then exposed to the MIT pattern, unexposed photoresist is developed away in 1% sodium carbonate solution and the exposed resist is stripped in potassium hydroxide solution to reveal the copper meander pattern. Samples are bent and creased by hand 90° perpendicular to the lines and spaces in 10 different areas of each sample, then examined using 10× magnification for defects such as cracks or delaminations. Any reported defects constitute a failure. Samples are evaluated "after cure" and "after solder", in which case samples are floated, coverlay side up, in 288° C. 60/40 tin/lead solder for 30 seconds, then cooled to room temperature and evaluated as described above.

MIT Folding Flexural Endurance

This test is designed to measure the number of folds to failure of etched flexible printed wiring circuit patterns processed with photoimageable coverlay. Samples for evaluation are typically MIT flex endurance patterns. The artwork for the test pattern has 0.04 inch wide traces on 0.08 inch centers meandering to make six tracks on a 5 inch ×5 inch specimen. The substrate to be used for this test is typically of the same type as that used in the actual product application, i.e. the same thickness, type and thickness (copper, adhesive). In addition, the photoimageable processing steps (pre-clean, lamination, cure, solder exposure) are duplicated so that the evaluation reflects a real-life representation. Flexural endurance is measured using a MIT Folding Endurance Tester.

The specimen is attached to the apparatus so that the sample is flexed perpendicular to the circuit lines. A 500 g weight is attached. The sample rotates back and forth, 135° in each direction, at a rate of 175 double bends per minute. The MIT Flexural Endurance Tester counts the flex repetitions until the sample is severed at the crease. The number of cycles registered on the counter is then recorded as the endurance factor for the material under test.

Chemical Resistance

This test is designed to analyze any degradation in film properties when exposed to chemicals in the photoimaging processing steps. Coverlay is processed on a circuit-patterned substrate (circuitry and substrate used should be of the same type as that found in actual use). Each sample is immersed for up to 15 minutes in a chemical typically used in processing. These chemicals include plating chemicals such as 10% NaOH, 10% HCl, 10% $H_2SO_4$ and cleaning solvents such as methyl ethyl ketone (MEK), trichloroethylene (TCE) and isopropanol (IPA). After immersion, each sample is examined using 10× magnification for defects such as delamination, wicking, embrittlement or solvent attack. Any defects found are reported as failures.

Pencil Hardness

This test is designed to analyze changes in the hardness of the coverlay after exposure to isopropyl alcohol. Coverlay is processed onto a blank substrate. After curing, the substrate is evaluated for pencil hardness according to ASTM D-3363. The reported value is then compared with a substrate that was immersed in isopropanol for 10 minutes, blotted dry and evaluated using the same method.

Gold Plating Testing

This test is designed to determine the resistance of the cured film to gold plating. Samples are placed for 3 minutes in 5% Metex® cleaner, followed by a 10 μ-in. etch in 25% Preposit® 746. The etched samples are plated in Copper Gleem® (PCM+) to 1 mil thickness at 30 amps/square foot for 36 minutes plated to 0.2 mil thickness in nickel sulfamate at 30 amps/square foot for 8 minutes, and plated to 0.04 mil (1 micron) thickness in gold potassium cyanide at 5 amps/square foot for 8 minutes. After gold plating the samples are examined for the effect of residue on the copper before gold plating which reduces the smoothness and uniformity of the gold surface. In addition, adhesive tape is placed over the plated gold circuit traces and quickly pulled away to assess adhesion. Adhesive tape is also placed over the coverlay and pulled in the same way to assess adhesion after gold plating. Samples pass when less than 1% of gold or coverlay is removed.

Elongation to Break

The coating is laminated on Teflon® sheet, exposed at 500 mj/sq cm, developed at 40° C. for two times the time to develop non-imaged material, air dried and cured for one hour at 170° C. The samples are cut into one-half inch wide strips with a JDC precision Sample Cutter (Thwing-Albert Instrument Co.). Samples tested as unconditioned material are placed into a zip-lock bag until testing. Samples that are conditioned are placed in a nitrogen-purged 100° C. oven, the temperature is held for one hour, and then the samples are allowed to slowly cool to room temperature over a three hour period. The samples are placed in a desiccator with dry magnesium sulfate, and held in this dry condition until tested on an Instron tester according to ASTM D-882-83 (Method A). The percent elongation is computed from the stress-strain data using Instron software Series IX Automated Materials Testing System 1.02C.

EXAMPLES

To further substantiate the invention, the examples below are provided. Materials used for the examples are:

| Co-Binders A. High MW copolymers | |
|---|---|
| Carboset® 525 | Acrylic acid-containing copolymer from B. F. Goodrich, Cleveland, OH. The $T_g$ is 37° C., the molecular weight is 200 M and the acid number is 80 |
| Carboset® 526 | Acrylic acid-containing copolymer from B. F. Goodrich, Cleveland, OH. The $T_g$ is 70° C., the molecular weight is 180 M and the acid number is 100 |
| Elvacite® 2627 | Copolymer of methyl methacrylate, ethyl acrylate and methacrylic acid (51/29/20) having a Tg of 87° C., molecular weight of 40 M and the acid number is 127 |
| Acrylic polymer #1 | Pentapolymer of N-tertiary-octylacrylamide, methyl methacrylate, acrylic acid, hydroxypropyl methacrylate, and tertiary-butylaminoethyl methacrylate (40/35/16/5/4) having a Tg of 120° C., a molecular weight of 50 M, and an acid number of 118 |
| Acrylic polymer #2 | Copolymer of methyl methacrylate, ethyl acrylate and acrylic acid (61.7/25.7/12.6) having a $T_g$ of 80.8° C., a molecular weight of 171 M and acid number of 91 |
| Acrylic polymer #3 | Copolymer of methyl methacrylate, ethyl acrylate and acrylic acid (61.7/25.8/12.5) having a $T_g$ of 68.1° C., a molecular weight of 101 M and acid number of 90.5 |
| Acrylic polymer #4 | Copolymer of methyl methacrylate, ethyl acrylate and acrylic acid (46.8/41.9/11.3) having a $T_g$ of 55.0° C., a molecular weight of 179 M and acid number of 81.5 |
| Acrylic polymer #5 | Copolymer of methyl methacrylate, ethyl acrylate and acrylic acid (46.8/41.9/11.3) having a $T_g$ of 42.2° C., a molecular weight of 122 M and acid number of 81.1 |
| B. Low MW copolymers | |
| Carboset® 515 | Acrylic acid containing polymer having a $T_g$ of −14° C., a molecular weight of 7 M and an acid number of 63 from B. F. Goodrich, Cleveland, OH |
| Low MW copolymer #1 | Copolymer of ethyl acrylate and acrylic acid (83/17), having a $T_g$ of 2.3° C., a molecular weight ($M_w$) of 6400, and an acid number of 117 |
| Low MW copolymer #2 | Copolymer of ethyl acrylate, acrylic acid and methyl methacrylate (73/17/10) having a $T_g$ of 12.4° C., a molecular weight of 8600, and an acid number of 114 |
| Monomers | |
| Ebecryl® 3704 | Diacrylate of bisphenol-A-diglycidyl ether from UCB Chemicals, Smyrna, GA. |
| Ebecryl® 6700 | Urethane diacrylate from UCB Chemicals, Smyrna, GA. |
| TMPTA | Trimethylolpropane triacrylate from UCB Chemicals Corp., Smyrna, GA |
| TRPGDA | Tripropylene glycol diacrylate from UCB Chemicals Corp., Smyrna, GA |
| Thermal Crosslinking Agents | |
| Blocked isocyanate #1 | Hexamethylene diisocyanate based polyisocyanate blocked with methyl ethyl ketoxime and dissolved at 75% solids in ethyl acetate |
| Blocked isocyanate #2 | Hexamethylene diisocyanate based polyisocyanate blocked with methyl ethyl ketoxime and dissolved at 75% solids in ethyl acetate |
| Initiators | |
| o-Cl HABI | Hexaarylbiimidazole |
| EMK | Ethyl Michler's Ketone |
| Irgacure® 369 | 2-benzyl-2-(dimethylamino)-1-[4-(4-morpholinyl)phenyl]-1-butanone from Ciba-Geigy Corporation, Hawthorne, NY |
| Detackifiers | |
| PVP K-120 | Polyvinylpyrrolidine from |

-continued

| Other Ingredients | GAF Chemicals Corp., Texas City, TX |
|---|---|
| Irganox ® 1010 | Antioxidant from Ciba Geigy Corp., Ardsley, NY |
| DayGlo ® HMO15A19 | Green dye from Dayglo Corp., Cleveland, OH |
| DayGlo ® HMO22A19 | Green dye from Dayglo Corp., Cleveland, OH |
| Cobratec ® CBT | A 50/50 mixture of 4 & 5 isomers of carboxybenzo-triazole from Specialties Group Inc., Cincinnati, OH |
| 5ATT | 5-amino-1,3,4-thiadiazole-2-thiol |

Examples 1 and 2

The coating components were mixed in the designated solvents to provide the proper solution rheology for applying the first and second coating layers.

The liquid photoimageable compositions were converted to dry films using a machine coater such as a Pilot Coater or an extrusion die coater. For films coated on a Pilot Coater, the liquid compositions were either extrusion-die coated or were coated using a 10 mil doctor knife onto a Mylar® polyester support film. A three-zone dryer with each zone 15 feet in length and with dryer temperatures of 50° C., 98° C., and 115° C. and a line speed of 20 feet per minute was typically used. A removable, 1 mil thick polyethylene coversheet was used to protect the coated substrate during storage.

In Example 1, the first permanent coating layer was coated to a thickness of 1 micrometer onto a 92A Mylar® polyester support film. The second permanent coating layer was then coated on top of the first layer to a thickness of 2 mils, air dried at elevated temperature and the exposed side of the second layer laminated to a 92D Mylar® polyester film.

In Example 2, the second permanent coating layer was coated to a thickness of 2 mils onto a 92D Mylar® polyester support film and then the first permanent coating layer was coated on top of the second coating layer to a thickness of 1 micrometer. A 1 mil thick double side matte polyethylene cover film was laminated to the exposed side of the first layer.

The permanent coating layers were laminated to circuit boards by using a DuPont solder mask vacuum laminator (SMVL) at 65° C. lamination temperature. The permanent coating layers, once laminated to circuit boards, were processed by imagewise exposure at 500 mj/cm2; spray development at 43° C. for two times the time to clear unexposed boards (41 seconds for Example 1 and 47 seconds for Example 2) in 1% aqueous sodium or potassium carbonate; and thermal curing at 150° C. for 1 hour.

| Component | Example 1 (% by weight) | Example 2 (% by weight) |
|---|---|---|
| First-layer: | | |
| Acetone | 45.0 | 45.0 |
| Methanol | 45.0 | 45.0 |
| Acrylic polymer #1 | 1.77 | 1.77 |
| Elvacite ® 2627 | 7.05 | 7.05 |
| 5-ATT | 0.02 | 0.02 |
| TMPTA | 0.90 | 0.90 |
| Irgacure ® 369 | 0.26 | 0.26 |
| Second layer: | | |
| Methanol | 19.95 | 19.95 |
| Ethyl acetate | 30.23 | 30.23 |
| Blocked isocyanate #1 | 5.16 | 5.16 |
| Ebecryl ® 6700 75% in ethyl acetate | 12.04 | 12.04 |
| Ebecryl ® 3704 75% in ethyl acetate | 10.09 | 10.09 |
| Carboset ® 515 | 2.15 | 2.15 |
| 5-ATT | 0.09 | 0.09 |
| o-Cl HABI | 0.21 | 0.21 |
| EMK | 0.04 | 0.04 |
| Irganox ® 1010 | 0.21 | 0.21 |
| Benzophenone | 1.20 | 1.20 |
| DayGlo ® HMO15A19 | 1.29 | 1.29 |
| PVP K-120 | 1.29 | 1.29 |
| Carboset ® 525 | 16.04 | 16.04 |

| Property | Example 1 | Example 2 |
|---|---|---|
| Time-to-clear (sec) | 41 | 47 |
| Stepwedge response | 4–10 | 4–10 |
| Cure conditions | 150° C./1 hr | 150° C./1 hr |
| Bend & Crease | | |
| Substrate: TecLam__ LF9110[1] with copper etched off one side and a MIT pattern on the other side of the laminate | | |
| After cure | Pass | Pass |
| After solder | Pass | Pass |
| Cross-Hatch Adhesion | | |
| Substrate: TecLam__ LF9110[1] that was chemically cleaned | | |
| After cure | Pass | Pass |
| After solder | Pass | Pass |
| % Elongation to Break | | |
| Conditioned | 77 | 58 |
| Chemical Resistance | | |
| Substrate: TecLam__ LF9110[1] that was chemically cleaned | | |
| Isopropanol | Pass | Pass |
| 10% $H_2SO_4$ | Pass | Slight edge delamination |
| 10% NaOH | Pass | Pass |

[1]TecLam__ LF9110 is a laminate material of 1 mil Kapton ® polyimide film coated on one side with 1 mil of epoxy-based adhesive and laminated to 1 ounce copper foil bonded to the adhesive side available from E. I. duPont de Nemours & Co.

Example 3

Example 3 was processed as previously described for Example 2. The second permanent coating layer was coated to a thickness of 2 mils on a 92A Mylar® polyester support film and then the first permanent coating layer was coated on top of the second layer to a thickness of 1.5 micrometers. A 1 mil thick double side matte polyethylene cover film was laminated to the exposed side of the first layer.

| Component | Example 3 (% by weight) |
|---|---|
| First layer: | |
| Acetone | 45.24 |
| Methanol | 45.24 |
| Acrylic polymer #1 | 1.69 |
| Elvacite ® 2627 | 6.72 |
| CBT | 0.02 |
| TMPTA | 0.85 |

| | |
|---|---|
| Irgacure ® 369 | 0.25 |
| Second Layer: | |
| Methanol | 20.00 |
| Ethyl acetate | 30.16 |
| Blocked isocyanate #1 | 5.16 |
| Ebecryl ® 6700 | 12.04 |
| 75% in ethyl acetate | |
| Ebecryl ® 3704 | 10.09 |
| 75% in ethyl acetate | |
| Carboset ® 515 | 2.15 |
| CBT | 0.09 |
| o-Cl HABI | 0.22 |
| EMK | 0.04 |
| Irganox ® 1010 | 0.22 |
| Benzophenone | 1.20 |
| DayGlo ® HMO15A19 | 1.29 |
| PVP K-120 | 1.29 |
| Carboset ® 525 | 16.04 |

| Property | Example 3 |
|---|---|
| Time-to-clear (sec) | 36 |
| Stepwedge response | 4–11 |
| Cure conditions | 160° C./1 hr |
| Bend Crease | |
| Substrate: TecLam ® LF91110[1] with copper etched off one side and a MIT pattern on the other side of the laminate | |
| After cure | Pass |
| After solder | Pass |
| Cross-Hatch Adhesion | |
| Substrate: TecLam_ LF9110[1] that was chemically cleaned | |
| After cure | Pass |
| After solder | 5% pickoff |
| % Elongation to Break | |
| Conditioned | 47 |
| MIT Folding Flex Endurance | |
| (Flex Cycles over TecLam_ 9121[2]) | 1424 |
| Pencil Hardness | |
| Before IPA soak | 2H |
| After IPA soak | HB |
| Gold Plating | |
| Adhesion of gold | Pass |
| Adhesion of second layer | Pass |
| Residue | None observed |

[2]Teclam_ LF9121 is a double side laminate of 2 mils thick Kapton ® polyimide film coated on both sides with 1 mil thick epoxy-based adhesive and laminated to 1 ounce copper foil on both sides available from E. I. duPont de Nemours & Co.

Example 4

In Example 4, the first permanent coating layer was coated on a 92A Mylar® polyester support film to an average thickness of 1.9 micrometer and the second layer was coated on top of the first layer to a thickness of 2.0 mils. A 1 mil 92D Mylar® polyester cover film was laminated to the exposed side of the second layer. An increased amount of TMPTA was used in the first layer but a very low tack surface was still obtained. Tack was assessed by folding the film back on itself and pulling the film apart to see if and how readily the film released.

| Component | Example 4 (% by weight) |
|---|---|
| First Layer: | |
| Dowanol ® PM | 45.0 |
| Acetone | 22.5 |
| Methanol | 22.5 |
| Acrylic polymer #1 | 1.65 |
| Elvacite ® 2627 | 6.56 |
| Ebecryl ® 6700 | 1.50 |
| Irgacure ® 369 | 0.26 |
| CBT | 0.02 |
| Second Layer: | |
| Methanol | 20.01 |
| Ethyl acetate | 30.16 |
| Blocked isocyanate #2 | 5.16 |
| Ebecryl ® 6700 | 12.04 |
| 75% in ethyl acetate | |
| Ebecryl ® 3704 | 10.09 |
| 75% in ethyl acetate | |
| Carboset ® 515 | 2.15 |
| 5-ATT | 0.09 |
| o-Cl HABI | 0.22 |
| EMK | 0.04 |
| Irganox ® 1010 | 0.22 |
| Benzophenone | 1.20 |
| DayGlo ® HMO15A19 | 1.29 |
| PVP K-120 | 1.29 |
| Carboset ® 525 | 16.04 |

| Property | Example 4 |
|---|---|
| Time-to-clear (sec) | 39 |
| Stepwedge response | 5–11 |
| Cure conditions | 170° C./1 hr |
| Bend & Crease | |
| Substrate: TecLam_ LF9110[1] with copper etched off one side and a MIT pattern on the other side of the laminate | |
| After cure | Pass |
| After solder | Pass |
| Cross-Hatch Adhesion | |
| Substrate: TecLam_ LF9110[1] that was chemically cleaned | |
| After cure | Pass |
| After solder | Pass |

Examples 5 to 7

Examples 5 to 7 illustrates multilayer coating compositions of the invention that have very low tack because in the first permanent coating layer of 2.0 micrometer thickness high Tg binders and low levels of photoactive acrylate monomers are present. The second permanent coating layer of Example 3 was coated on each of the first coating layers. A 1 mil 92D Mylar® polyester support film was laminated to the exposed surface of the second layer.

| | First Layer: | | |
|---|---|---|---|
| Component | Example 5 (% by weight) | Example 6 (% by weight) | Example 7 (% by weight) |
| Dowanol ® PM | 45.0 | 45.0 | 45.0 |
| Acetone | 22.5 | 22.5 | 22.5 |
| Methanol | 22.5 | 22.5 | 22.5 |
| Acrylic polymer #1 | 1.75 | 1.71 | 1.71 |
| Elvacite ® 2627 | 7.06 | 6.76 | 6.76 |
| TRPEGA | 0.89 | 0 | 0 |
| Irgacure ® 369 | 0.26 | 0 | 0 |
| TMPTA | 0 | 1.27 | 1.27 |

-continued

First Layer:

| Component | Example 5 (% by weight) | Example 6 (% by weight) | Example 7 (% by weight) |
|---|---|---|---|
| Low MW copolymer #1 | 0 | 0.26 | 0 |
| Low MW copolymer #2 | 0 | 0 | 0.26 |

Examples 5 to 7 provide a low tack level and delaminate after film is folded back on itself. These examples, as well as Examples 1 to 4, illustrate compositions that have low enough tack that film will not stick to itself irreversibly and will not prematurely tack down to the circuit substrate before vacuum is applied during SMVL lamination.

Comparative Examples 1C to 5C

In Comparative Examples 1C to 5C, the first permanent coating of 2.0 micrometer thickness was coated on a 92A Mylar® polyester support film and then the second permanent coating layer of Example 3 was coated over the top of the first layer. The multilayer coating compositions disadvantageously provided a tacky surface which caused the film to tack to itself when folded over and allowed the film to pre-tack to circuit substrates or other surfaces after the cover film was removed. These comparative examples used lower Tg binder in the first permanent coating.

First Layer:

| Component | Comparative Example 1C (% by weight) | Comparative Example 2C (% by weight) | Comparative Example 3C (% by weight) |
|---|---|---|---|
| Dowanol® PM | 45.0 | 45.0 | 45.0 |
| Acetone | 22.5 | 22.5 | 22.5 |
| Methanol | 22.5 | 22.5 | 22.5 |
| Acrylic polymer #1 | 1.79 | 1.79 | 1.79 |
| Acrylic polymer #2 | 0 | 7.06 | 0 |
| Acrylic polymer #3 | 0 | 0 | 7.06 |
| Carboset® 526 | 7.06 | 0 | 0 |
| TMPTA | 0.89 | 0.89 | 0.89 |
| Irgacure® 369 | 0.26 | 0.26 | 0.26 |

First Layer:

| Component | Comparative Example 4C (% by weight) | Comparative Example 5C (% by weight) |
|---|---|---|
| Dowanol® PM | 45.0 | 45.0 |
| Acetone | 22.5 | 22.5 |
| Methanol | 22.5 | 22.5 |
| Acrylic polymer #1 | 1.79 | 1.79 |
| Acrylic polymer #4 | 7.06 | 0 |
| Acrylic polymer #5 | 0 | 7.06 |
| TMPTA | 0.89 | 0.89 |
| Irgacure® 369 | 0.26 | 0.26 |

What is claimed is:

1. An aqueous processable, multilayer, photoimageable, permanent coating element having low tack when placed in contact with a printed circuit board and capable of withstanding molten solder after cure, which comprises:

(a) a temporary support film;
(b) a first layer of a photoimageable permanent coating composition comprising:
  (i) an amphoteric binder;
  (ii) a carboxyl group containing copolymer binder of the formula

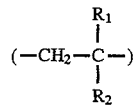

wherein R1 is H or alkyl; $R_2$ is phenyl or —$CO_2R_3$; and $R_3$ is H or alkyl which is unsubstituted or substituted with one or more hydroxy groups;
  (iii) a monomer component containing at least two ethylenically unsaturated groups; and
  (iv) a photoinitiator or photoinitiator system;
(c) a second layer of a photoimageable permanent coating composition comprising:
  (i) a cobinder system comprising an admixture of at least one low molecular weight copolymer binder component having a molecular weight of from 3,000 to 15,000 and containing from 2 to 50% by weight of at least one carboxylic acid containing structural unit and from 50 to 98% by weight of at least one structural unit of the formula

wherein $R_4$ is H, alkyl, phenyl or aryl; $R_5$ is H, $CH_3$, phenyl, aryl, —$COOR_6$, —$CONR_7R_8$ or —CN; and $R_6$, $R_7$ and $R_8$ independently are H, alkyl or aryl, which is unsubstituted or substituted with one or more hydroxy, ester, keto, ether or thioether groups; and at least one high molecular weight carboxylic acid containing copolymer binder component having a molecular weight of from 40,000 to 500,000 and containing structural units of the formula

wherein $R_9$ is H, alkyl, —CN, phenyl, alkylphenyl or aryl; $R_{10}$ is phenyl, alkylphenyl, aryl, —$COOR_{11}$ or —$CONR_7R_8$; $R_{11}$ is H or alkyl; and wherein alkyl contains from 1 to 8 carbon atoms;
  (ii) an acrylated urethane monomeric component;
  (iii) a photoinitiator or a photoinitiator system; and
  (iv) a blocked polyisocyanate crosslinking agent.

2. The multilayer, permanent coating element of claim 1 wherein the first photoimageable coating layer (b) is interposed between the temporary support film (a) and the second photoimageable coating layer (c).

3. The multilayer, permanent coating element of claim 1 wherein the second photoimageable coating layer (c) is interposed between the temporary support film (a) and the first photoimageable coating layer (b).

4. The multilayer, permanent coating element of claim 2 further comprising a second temporary support film on the exposed surface of the second photoimageable coating layer (c).

5. The multilayer, permanent coating element of claim 3 further comprising a removable cover film on the exposed surface of the first photoimageable coating layer (b).

6. The multilayer, permanent coating element of claim 5 wherein the first photoimageable coating layer (b) releases from the removable cover film before the second photoimageable coating layer (c) releases from the temporary support film (a).

7. The multilayer, permanent coating element of claim 4 wherein the first photoimageable coating layer (b) releases from the temporary support film (a) before the second photoimageable coating layer (c) releases from the adjacent temporary support film.

8. The multilayer, permanent coating element of claim 1 wherein the temporary support film is selected from the group consisting of polyamides, polyolefins, polyesters, vinyl polymers and cellulose esters.

9. The multilayer, permanent coating element of claim 8 wherein the temporary support film is polyethylene terephthalate having a thickness of from 6 to 200 microns.

10. The multilayer, permanent coating element of claim 5 wherein the cover film is selected from the group consisting of polyester, silicone treated polyester, polyethylene or polypropylene.

11. The multilayer, permanent coating element of claim 10 wherein at least one surface of the cover film has a matte or an embossed finish.

12. The multilayer, permanent coating element of claim 11 wherein the cover film contains inorganic filler particles.

13. The multilayer, permanent coating element of claim 8 wherein at least one surface of the temporary support film has a matte or an embossed finish.

14. The multilayer, permanent coating element of claim 13 wherein the temporary support film contains inorganic filler particles.

15. The multilayer, permanent coating element of claim 1 wherein the amphoteric binder comprises a copolymer derived from the copolymerization of (a) from 30 to 60 parts by weight of an $N-C_{1-12}$ alkyl acrylamide or methacrylamide or a $C_{1-4}$ alkyl aminoalkyl acrylate or methacrylate; (b) from 10 to 20 parts by weight of an acidic comonomer selected from the group consisting of acrylic acid, methacrylic acid, crotonic acid, itaconic acid, maleic acid, fumaric acid and the $C_{1-4}$ alkyl half esters of maleic and fumaric acid; and (c) from 20 to 55 parts by weight of a comonomer selected from the group consisting of $C_{1-12}$ alkyl(meth)acrylates, $C_{2-4}$ hydroxyalkyl(meth)acrylates and hydroxystearyl(meth)acrylates, wherein the parts by weight of the comonomers totals 100 parts.

16. The multilayer, permanent coating element of claim 15 wherein the amphoteric binder comprises a copolymer of from 35 to 45 parts by weight of N-tertiary-octyl acrylamide, from 12 to 18 parts by weight of acrylic or methacrylic acid, from 32 to 38 parts by weight of methyl methacrylate, from 2 to 10 parts by weight of hydroxypropyl acrylate and from 2 to 10 parts by weight of $C_{1-4}$ alkyl aminoalkyl(meth) acrylate, wherein the parts by weight of the comonomers totals 100 parts.

17. The multilayer, permanent coating element of claim 1 wherein said monomer component is selected from the group consisting of hexamethylene glycol diacrylate, triethylene glycol diacrylate, tripropylene glycol diacrylate, pentaerythritol triacrylate, trimethylolpropane triacrylate, polyoxyethylated trimethylolpropane triacrylate, pentaerythritol triacrylate, pentaerythritol tetracrylate, bisphenol A diacrylate, di-(3-acryloxy-2-hydroxypropyl) ether of bisphenol-A, di-(3-acryloxy-2-hydroxypropyl) ether of tetrabromo-bisphenol-A, aliphatic urethane diacrylate and aromatic urethane diacrylate.

18. The multilayer, permanent coating element of claim 1 wherein the carboxylic acid containing structural unit of the low molecular weight copolymer binder component comprises acrylic acid, methacrylic acid, maleic acid, maleic acid half ester or anhydride, itaconic acid, itaconic acid half ester or anhydride, citraconic acid or citraconic acid half ester or anhydride.

19. The multilayer, permanent coating element of claim 18 wherein the carboxylic acid containing structural unit of the low molecular weight copolymer binder component comprises acrylic acid or methacrylic acid.

20. The multilayer, permanent coating element of claim 1 wherein the structural unit (A) of the low molecular weight copolymer binder component comprises styrene or esters and amides of acrylic and methacrylic acid.

21. The multilayer, permanent coating element of claim 20 wherein structural unit (A) of the low molecular weight copolymer binder component comprises methyl methacrylate, ethyl methacrylate, butyl methacrylate, methacrylamide, methyl acrylate, ethyl acrylate, butyl acrylate, hydroxyethyl acrylate, hydroxyethyl methacrylate or acrylamide.

22. The multilayer, permanent coating element of claim 1 wherein the structural units (B) of the high molecular weight carboxylic acid-containing copolymer binder component comprise styrene, methacrylic acid, methyl methacrylate, ethyl methacrylate, butyl methacrylate, acrylic acid, methyl acrylate, ethyl acrylate, butyl acrylate, hydroxyethyl acrylate, hydroxyethyl methacrylate or hydroxypropyl methacrylate.

23. The multilayer, permanent coating element of claim 22 wherein the structural units (B) of the high molecular weight carboxylic acid containing copolymer binder component comprise methacrylic acid or acrylic acid.

24. The multilayer, permanent coating element of claim 1 wherein the high molecular weight carboxylic acid copolymer binder component comprises a copolymer of methyl methacrylate, ethyl acrylate and methacrylic acid.

25. The multilayer, permanent coating element of claim 1 wherein the low molecular weight carboxylic acid copolymer binder component comprises a copolymer of ethyl acrylate and acrylic acid.

26. The multilayer, permanent coating element of claim 1 wherein the high molecular weight carboxylic acid copolymer binder component comprises a copolymer of styrene and maleic anhydride, acid, ester, half-ester or half-amide.

27. The multilayer, permanent coating element of claim 1 comprising from 2 to 50% by weight of the low molecular weight copolymer binder component and from 50 to 98% by weight of the high molecular weight carboxylic acid copolymer binder component, based on the total weight of the cobinder system.

28. The multilayer, permanent coating element of claim 1 wherein the acrylated urethane monomeric component has the structure:

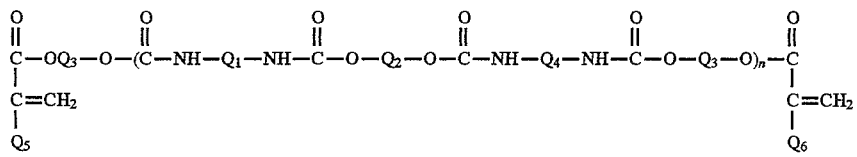

wherein n is at least one; $Q_1$ and $Q_4$ are aromatic groups which may be unsubstituted or substituted by lower alkyl groups and which can contain a lower alkylene group as a connecting member; $Q_2$ and $Q_3$ are independently polyoxyalkylene containing 1 to 10 carbon atoms; $Q_5$ and $Q_6$ are independently alkyl of 1 to 3 carbon atoms or H.

29. The multilayer, permanent coating element of claim 28 wherein the acrylated urethane monomeric component is a urethane diacrylate comprising the reaction product of toluene diisocyanate with a polyol and the end isocyanate groups end-capped with hydroxyethyl acrylate.

30. The multilayer, permanent coating element of claim 28 wherein the acrylated urethane monomeric component is a urethane triacrylate comprising the reaction product of toluene diisocyanate with a polyol and the end isocyanate groups end-capped with hydroxyethyl acrylate.

31. The multilayer, permanent coating element of claim 1 wherein the acrylated urethane monomeric component is a urethane diacrylate or triacrylate.

32. The multilayer, permanent coating element of claim 1 wherein the acrylated urethane monomeric component is a urethane diacrylate or triacrylate containing carboxylic acid groups.

33. The multilayer, permanent coating element of claim 1 wherein the blocked polyisocyanate crosslinking agent comprises an aliphatic, cycloaliphatic, aromatic or arylaliphatic di, tri or tetraisocyanate whose isocyanate groups are blocked by betacarbonyl compounds, hydroxamates, triazoles, imidazoles, tetrahydropyrimidines, lactams, ketoximines, oximes, low molecular weight alcohols, phenols or thiophenols.

34. The photopolymerizable permanent coating element of claim 33 wherein the blocked polyisocyanate comprises the trimer of hexamethylene diisocyanate blocked with methylethyl ketoxime.

35. The multilayer, permanent coating element of claim 33 wherein the blocked polyisocyanate comprises isophorone diisocyanate blocked with methyl ethyl ketoxime.

36. The multilayer, permanent coating element of claim 27 comprising from 4 to 45% by weight of the low molecular weight copolymer binder component and from 55 to 96% by weight of the high molecular weight carboxylic acid copolymer binder component.

37. The multilayer, permanent coating element of claim 36 wherein the low molecular weight copolymer binder component has a molecular weight ranging from 4,000 to 10,000 and the high molecular weight copolymer binder component has a molecular weight ranging from 100,000 to 250,000.

38. The multilayer, permanent coating element of claim 27 wherein the ratio of the low molecular weight copolymer binder component to the high molecular weight copolymer binder component ranges from 0.05 to 0.55.

39. The multilayer, permanent coating element of claim 37 wherein the low molecular weight binder component comprises a copolymer of ethyl acrylate and acrylic acid and the high molecular weight binder component comprises a copolymer of methyl methacrylate, ethyl acrylate and acrylic acid.

* * * * *